United States Patent
Graham, Jr. et al.

(10) Patent No.: US 8,173,525 B2
(45) Date of Patent: May 8, 2012

(54) SYSTEMS AND METHODS FOR NANOMATERIAL TRANSFER

(75) Inventors: Samuel Graham, Jr., Lithonia, GA (US); William P. King, Atlanta, GA (US); Ching-ping Wong, Berkeley Lake, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1359 days.

(21) Appl. No.: 11/454,334

(22) Filed: Jun. 16, 2006

(65) Prior Publication Data

US 2008/0283269 A1    Nov. 20, 2008

Related U.S. Application Data

(60) Provisional application No. 60/691,566, filed on Jun. 17, 2005.

(51) Int. Cl.
*H01L 21/00* (2006.01)
*H01L 21/20* (2006.01)

(52) U.S. Cl. ............... 438/496; 257/E21.575; 977/707; 977/887

(58) Field of Classification Search ........... 257/E21.575; 438/496, 589, 616, 670; 977/707, 887
See application file for complete search history.

(56) References Cited

U.S. PATENT DOCUMENTS

| 6,436,221 | B1 | 8/2002 | Chang et al. |
| 7,105,428 | B2 * | 9/2006 | Pan et al. ............... 438/584 |
| 7,245,370 | B2 * | 7/2007 | Bratkovski et al. ........ 356/301 |
| 2003/0092207 | A1 | 5/2003 | Yaniv et al. |
| 2005/0165155 | A1 | 7/2005 | Blanchet-Fincher |

FOREIGN PATENT DOCUMENTS

| KR | 2005028350 | 3/2005 |
| WO | WO 97/06012 | 2/1997 |
| WO | WO 2004/013697 | 2/2004 |
| WO | WO 2004/027460 | 4/2004 |

OTHER PUBLICATIONS

Int'l Search Report & Written Opinion for corresponding PCT Application No. PCT/US2006/023391 dated Jun. 5, 2007.

* cited by examiner

*Primary Examiner* — William D Coleman
(74) *Attorney, Agent, or Firm* — Trenton A. Ward, Esq.; Troutman Sanders LLP

(57) ABSTRACT

Systems and methods of nanomaterial transfer are described. A method of nanomaterial transfer involving fabricating a template and synthesizing nanomaterials on the template. Subsequently, the nanomaterials are transferred to a substrate by pressing the template onto the substrate. In some embodiments, the step of transferring the nanomaterials involves pressing the template onto the substrate such that the nanomaterials are embedded below a surface layer of the substrate. In some embodiments, the temperature of the plurality of nanomaterials is raised to assist the transfer of the nanomaterials to the substrate.

25 Claims, 16 Drawing Sheets

SYSTEMS AND METHODS FOR NANOMATERIAL TRANSFER

CROSS REFERENCE TO RELATED APPLICATIONS

This application claims priority of U.S. Provisional Patent Application No. 60/691,566, filed Jun. 17, 2005, the entire contents and substance of which are hereby incorporated by reference.

BACKGROUND

1. Field of the Invention

The present invention relates to a nanomaterials and, more particularly, to flexible devices containing nanomaterials.

2. Description of Related Art

Electronic devices are responsible for the majority of advancements in technology in the last century, and the complexity of these devices grows in proportion to the exponential advancements in the field. As electronic devices continue to expand into every facet of everyday life, the demand for more durable, robust, and flexible electronic devices becomes increasingly significant. Recent discoveries with respect to nanomaterials have opened new doors with respect to enabling durable, robust, and flexible electronic devices, but these new discoveries come with equally challenging obstacles.

One of the significant challenges encountered with use of nanomaterials in electronic devices relates to a dichotomy between conductive and flexible materials. More specifically, a general dichotomy exists between materials with superior electrical, optoelectronic, semiconductor and/or structural characteristics and materials that are highly compatible with flexible, malleable, and durable composites. Typically materials that have excellent transport properties, regarding conductivity and carrier mobility, are difficult or impossible to directly process on or with materials that are flexible, malleable, and durable. Conversely, those materials that have poor electrical properties are more likely to be compatible with flexible, malleable, and durable materials. In accordance with this dichotomy, nanomaterial structures that have excellent transport or structural properties, such as carbon nanotubes or semiconductor nanowires, are difficult to process and fabricate with flexible, malleable, and durable materials such as polymer substrates. Therefore, it is highly desired to develop methods and systems which permit the incorporation of nanomaterial structures into flexible, malleable, and durable materials, such as polymer substrates.

As nanomaterial structures, such as carbon nanotubes and semiconductor nanowires, are the product of recent discoveries, their applications and uses are widely undeveloped and undiscovered. The discovery of carbon nanotubes by Sumio Iijima, a Japanese physicist, in 1991 may ultimately prove to be one of the most significant discoveries of the twentieth century as it spurned the growth of research in the 1-D nanomaterials revolution. Prior to Dr. Iijima's discovery, solid state carbon was know to appear only in four basic structures: "diamond structures," "graphite structures," "non-crystalline structures," and "fullerene molecules." In 1991, Dr. Iijima discovered a tube-shaped material made up of carbon in a continuous hexagonal mesh and with a diameter measuring on the order of a nanometer, one-billionth of a meter. The far-reaching benefits of carbon nanotubes ("CNTs") stem from their unique and novel electronic, thermal, and structural properties. A CNT is cylindrical in structure and may be around one nanometer in diameter and up to several micrometers in length. In other words, the length of a CNT may potentially be millions of times greater than their molecularized diameter. The small diameter of the CNT is due to the fact that its tubular body is typically only a few atoms in circumference. The CNTs are hollow and have a linear fullerene structure. Due to the carbon to carbon covalent bonding and the seamless hexagonal network, CNTs are quite possibly the strongest known molecular structure. For example, the strength to weight ratio is 500 times greater than that of aluminum. CNTs have a tensile strength of 63 gigapascals ("GPa"), compared to high carbon steel at 1.2 GPa. CNTs are light, flexible, stable and generally inert.

CNTs can be formulated to exhibit varying degrees of conductivity, depending upon their chirality. The chirality, or "twist" of the nanotube structure can alter the density of the hexagonal lattice structure and thus effect the conductivity of the nanotube. Therefore, CNTs can be formulated to be either metallic or semiconductive. Metallic CNTs, exhibit electrical conductivity on the order of six times greater than that of copper. In addition to good conductance, CNTs exhibit a very high current carrying capacity. Significantly, with lengths of several microns and diameters of a few nanometers, CNTs form microtips with high aspect ratios, which are excellent field emitters.

CNTs are generally good thermal conducts in the axial direction, along their tube axis, and insulative in the radial direction, along an axis lateral to the tube axis. Furthermore, CNTs are incredibly efficient conductors of heat, with a potential thermal conductivity of 3000 W/mK.

CNTs can be of two main types of structures, Multiwalled Nanotbues (MWNTs) and Single Walled Nanotubes (SWNTs). A SWNT is simply one cylindrical hexagonal carbon structure that can be very long in length. MWNTs have multiple layers of encapsulated cylindrical hexagonal carbon structures. MWNTs can have multiple SWNTs concentric cyldinders inside a large SWNT or one SWNT inside a larger SWNT.

Carbon nanotubes are generally produced by three main techniques, arc discharge, laser ablation and chemical vapor deposition. In arc discharge, a vapor is created by an arc discharge between two carbon electrodes with or without catalyst. Nanotubes self-assemble from the resulting carbon vapor. In the laser ablation technique, a high-power laser beam impinges on a volume of carbon-containing feedstock gas (methane or carbon monoxide). Laser ablation typically produces a small amount of clean nanotubes, whereas arc discharge methods generally produce large quantities of impure material.

Chemical vapor deposition (CVD) synthesis is achieved by putting a carbon source in the gas phase and using an energy source, such as a plasma or a resistively heated coil, to transfer energy to a gaseous carbon molecule. Commonly used gaseous carbon sources include methane, carbon monoxide and acetylene. The energy source is used to "crack" the molecule into reactive atomic carbon. Then, the carbon diffuses towards the substrate, which is heated and coated with a catalyst (usually a first row transition metal such as Ni, Fe, Mo or Co) where it will bind. Carbon nanotubes will be formed if the proper parameters are maintained through the vapor liquid solid growth mechanism. Excellent alignment, as well as positional control on nanometer scale, can be achieved by using CVD. Control over the diameter, as well as the growth rate of the nanotubes can also be maintained. The appropriate metal catalyst can preferentially grow single rather than multi-walled nanotubes.

The current applications and potential applications for CNTs are amazingly varied and wide in range. The CNTs superior and unique properties afford an almost unending number of novel implementations and improvements to a variety of fields. CNTs are currently used or contemplated for use in nanoelectronics, biosensors, chemical sensors, optical sensors, solar cells, magnets, slick surfaces, combat jackets, transistors, oscillators, high strength composites, and superconductors.

The unique properties of CNTs present novel possibilities with respect to nanoelectronics, biosensors, chemical sensors, optical sensors, and similar devices. For example, nanomaterials are ideal for chemical sensors because they have very large surface areas. This large surface area translates into large adsorption rates of gases and vapors. Similarly, every atom in CNT is on the surface, thus it is incredibly sensitive to the environment, and small changes in charge environment can drastically change the electrical properties of the CNT. Indeed, SWNT field effect transistors have been fabricated wherein a single SWNT or a film of multiple SWNTs forms the conducting channel. Therefore, the conductance of the channel will change upon exposure of SWNT to certain chemical gases. Chemical sensing can thus be executed by monitoring the conductance of the channel.

A significant potential application for carbon nanotubes that has been the subject of much research and development is their potential use in flexible electronic devices. Conventionally, flexible electronic devices have relied upon advancements in semiconductor fabrication. In particular, the plasma-enhanced deposition of amorphous silicon onto polymer substrates has been utilized to create flexible semiconductor devices. Despite its advantages, the use of amorphous silicon in flexible electronic devices has significant drawbacks. For instance, in general, the processing temperature requirements for amorphous silicon limit its compatibility to a small number of polymers. Furthermore, the low transport mobility of amorphous silicon, on the order of 1 $cm^2/Vs$, limits the applications in which the resulting flexible electronic device can be utilized.

The use of carbon nanotubes has been contemplated to overcome the inherent problems of amorphous silicon in flexible electronic device applications. Carbon nanotubes have transport mobilities, which are several orders of magnitude greater than amorphous silicon. The performance of random CNT network devices has demonstrated electron mobility as high as 270 $cm^2/Vs$ and transistor on-off ratios as high as 10,000. Therefore, a significant desire exists to be able to incorporate CNTs into flexible electronic devices. Unfortunately, many problems exist in the compatibility of CNTs with flexible polymer substrates. More specifically, the synthesis of CNTs directly onto polymer substrates is not feasible due to the high temperatures or harsh chemical environments under which they are synthesized.

Conventional methods have attempted to address the challenge of incorporating CNTs into flexible polymer substrates with solution-based transfers. Solution-based carbon nanotube transfer processes, such as spin casting, flow-directed alignment, electrophoretic trapping, chemical functionalization, or microcontact printing, involves suspending the CNTs in an "ink" solution. The solution may act as the vehicle to transport the CNTs to the surface of the polymer substrate.

For example, U.S. Pat. No. 6,436,221 to Chang, et al., filed Feb. 7, 2001, describes a solution-based method of transfer of carbon nanotubes to a substrate. In the disclosed method, a conductive pattern is coated on a substrate by screen-printing a conductive slurry containing silver through a patterned screen. Next, a CNT paste, consisting of an organic bonding agent, resin, silver powder, and CNTs, is screen-printed through a mesh pattern screen onto the substrate. Subsequently, the substrate is baked at a predetermined temperature to remove the solvent, then sintered to solidify the CNT to the conductive pattern. Finally an adhesive film, such as tape is closely attached on the cathode substrate and then is then removed so as to discard the badly bonded CNT portions and to vertically pull up a portion of the CNT which laid down during the sintering.

U.S. Patent Application No. 2003/0092207 to Yaniv, et al., published May 15, 2003, describes a solution-based CNT transfer process. Yaniv, et al. discloses a process involving obtaining carbon nanotube powder, grinding the powder into shorter length CNTs, and mixing the powder in a solution in an ultrasonic process to disperse the CNTs. After the mixture solution has been created it is spayed onto the substrate with an atomizer, then tape is used to remove a portion of the CNTs from the surface, thereby leaving a layer of CNTs on the surface of the substrate.

U.S. Patent Application No. 2005/0165155 to Blanchet-Fincher, published Jul. 28, 2005, describes a method of creating a composition comprising carbon nanotubes and conductive polyaniline. The method disclosed involves creating a mixture of carbon nanotubes and conductive polyaniline by dispersing carbon nanotubes in xylenes and then adding a solution of doped polyaniline to the dispersion. Subsequently, a solution of insulating polymer is added to the dispersion, the dispersion is deposited on a substrate, and the solvent is allowed to evaporate. The result is a polymer composition containing carbon nanotubes.

Many problems exist with the solution-based CNT transfer methods, such as the methods disclosed in Chang, et al., Yaniv, et al. and Blanchet-Fincher, due to, among other things, the fact that the carbon nanotubes are fragile, vulnerable to separation, and randomly oriented in the solution. The random orientation in the solution results in a random orientation of the carbon nanotubes on the substrate. This random orientation of the CNTs can be detrimental to many applications, including creating non-optimized electrical field distribution and resulting in shielding effects between adjacently positioned CNTs. Additionally, the inks and solvents used to transfer the carbon nanotubes must be compatible with the polymer substrate. This significantly limits the choice of ink and solvents and the choice of polymers. Furthermore, the flexible electronic devices created by these solution-based transfer methods are very vulnerable, due to the fact that the CNTs simply reside on the surface of the substrate to which they applied. The development of solution-based CNT transfer inks require extensive fabrication time cycles. The create of the ink requires a significant amount of time to disperse the CNTs throughout the solution. Furthermore, the solution-based method involves many steps. Even after the solution has been applied to the substrate, the solution must be printed and the "solvent" evaporated (requiring more processing time). Additional steps must be taken if control over the arrangement and orientation is desired in solution based deposition techniques.

Similar problems are encountered in the manufacture of flexible electronic devices that incorporate nanomaterial structures other than CNTs. For example, known methods for the incorporation of nanowires into flexible polymer substrates suffer from the same problems as the described conventional methods for CNT transfer. In transferring the nanowires to a polymer substrate, the integrity of the nanowire structure is often lost or degraded and the nanowires are only tenably attached to the polymer substrate.

Accordingly, there is a need in the art for an efficient method by which to create an effective flexible electronic device incorporating nanomaterials.

Additionally, there is a need in the art for an efficient method to mass produce flexible electronic devices that incorporate nanomaterials with minimal processing steps.

Additionally, there is a need in the art for an efficient method to mass produce flexible electronic devices that incorporate carbon nanotubes with minimal processing steps.

Additionally, there is a need in the art for method to transfer carbon nanotubes to a flexible electronic device.

Additionally, there is a need in the art for method to transfer nanowires to a flexible electronic device.

Additionally, there is a need in the art for a method to transfer nanomaterials to a variety of polymer types.

Additionally, there is a need in the art for a method to transfer carbon nanotubes to a variety of polymer types.

Additionally, there is a need in the art for a flexible electronic device comprised of systematically arranged nanomaterials.

Additionally, there is a need in the art for a flexible electronic device comprised of systematically arranged carbon nanotubes.

Additionally, there is a need in the art for a flexible electronic device comprised of systematically arranged nanowires.

Additionally, there is a need in the art for method to create a flexible electronic device comprised of systematically arranged carbon nanotubes.

Additionally, there is a need in the art for method by which to integrate carbon nanotubes into a polymer substrate in a manner that enable control over the general orientation of a portion of the carbon nanotubes.

BRIEF SUMMARY

The present invention provides systems and methods for nanomaterial transfer. Various embodiments of the present invention overcome the deficiencies in the prior art, by providing an efficient and highly compatible method of nanomaterial transfer.

In an exemplary embodiment, the method of nanomaterial transfer involves fabricating a template and synthesizing nanomaterials on the template. Subsequently, the nanomaterials are transferred to a substrate by pressing the template onto the substrate. In some embodiments, the step of transferring the nanomaterials involves pressing the template onto the substrate such that the nanomaterials are embedded below the surface layer of the substrate. In some embodiments, the temperature of the plurality of nanomaterials is raised to assist the transfer of the nanomaterials to the substrate.

These and other objects, features and advantages of the present invention will become more apparent upon reading the following specification in conjunction with the accompanying drawing figures.

DETAILED DESCRIPTION OF PREFERRED EMBODIMENTS

Figure 1:
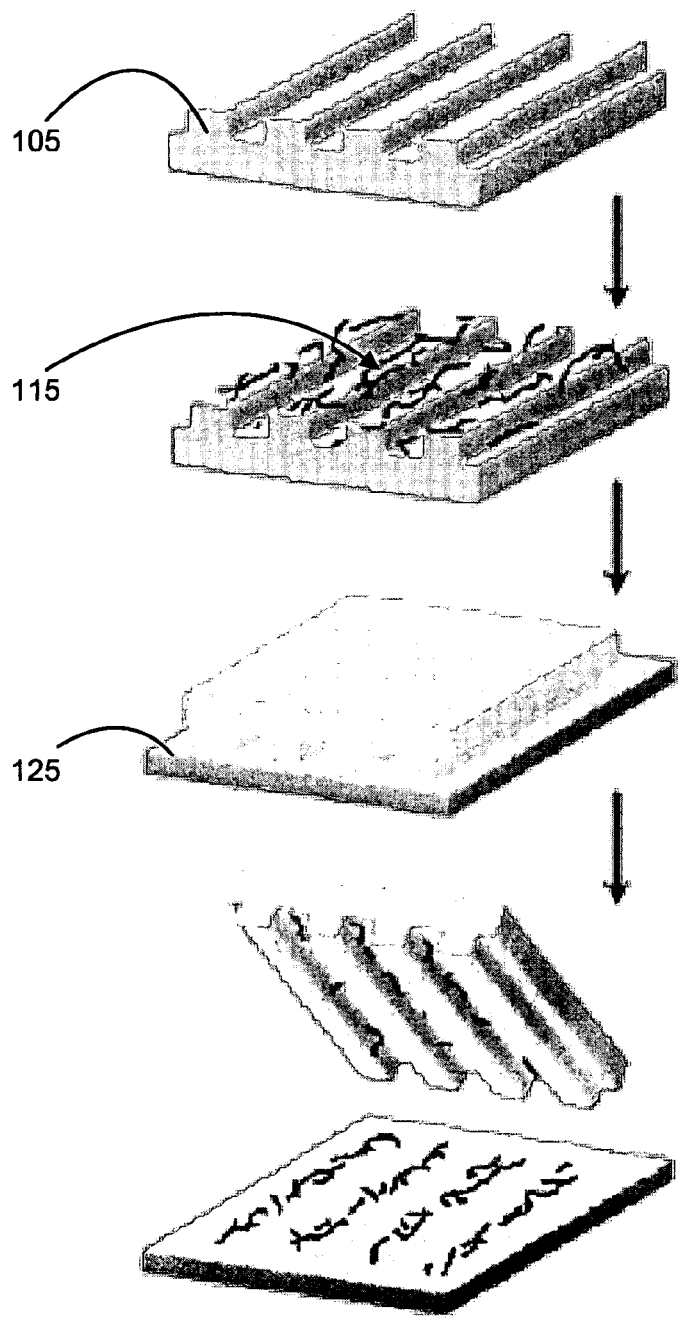
FIG. 1 is an illustration of a prior art method of transferring carbon nanotubes to a polymer substrate.

To facilitate an understanding of the principles and features of the invention, it is explained hereinafter with reference to its implementation in illustrative embodiments. In particular, the present invention is directed toward systems and methods for nanomaterial transfer.

Referring now to the figures, wherein like reference numerals represent like parts throughout the several views, exemplary embodiments of the present invention will be described in detail. Throughout this description, various components may be identified having specific values, these values are provided as exemplary embodiments and should not be limiting of various concepts of the present invention as many comparable sizes and/or values may be implemented.

FIG. 1 is an illustration of a prior art method of transferring carbon nanotubes to a polymer substrate. The conventional solution-based method illustrated in FIG. 1 utilizes a Polydimethylsiloxane (PDMS) applicator 105. PDMS is a widely used silicon-based organic material. The first step of the process involves the creation of the PDMS applicator 105. In the second step, an "ink" solution 115 containing a suspension of carbon nanotubes can then be applied to the PDMS applicator. In the third step, the PDMS applicator 105 is applied to a receiving polymer substrate 125. In the fourth step, the carbon nanotubes are transferred to the polymer substrate 125 from the raised regions of the PDMS applicator 105 and the PDMS applicator 105 is removed. Once the solvent of the ink solution 115 dries, the carbon nanotubes reside on the top surface of the polymer substrate 125.

Figure 2:
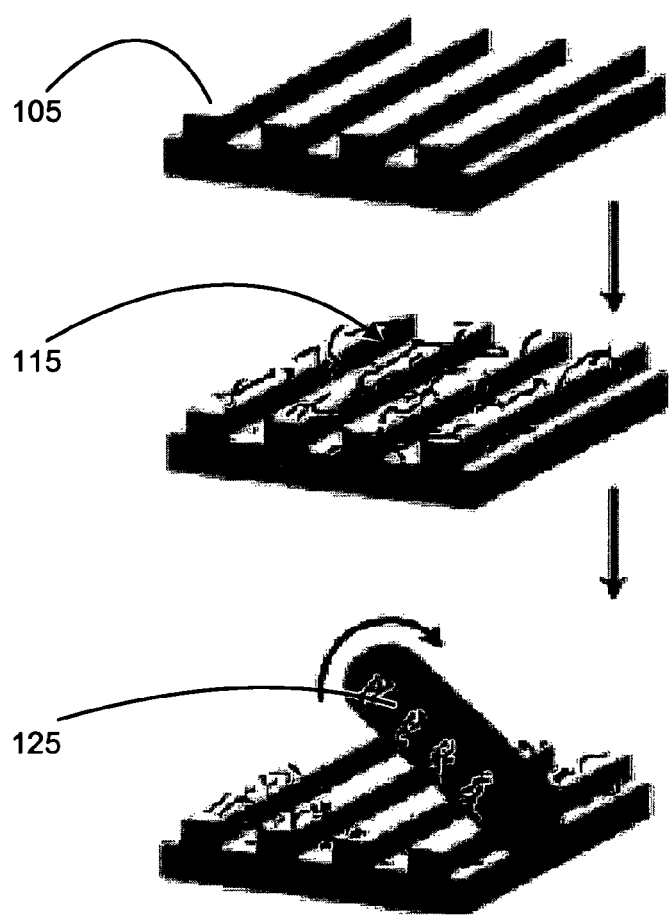
FIG. 2 is an illustration of a prior art method of transferring carbon nanotubes to a polymer substrate.

FIG. 2 is an illustration of a prior art method of transferring carbon nanotubes to a polymer substrate. Similar to the method in illustrated in FIG. 1, the conventional solution-based method illustrated in FIG. 2 utilizes a PDMS applicator 105. The first step of the process involves the creation of the PDMS applicator 105. In the second step, an "ink" solution 115 containing a suspension of carbon nanotubes can then be applied to the PDMS applicator. In the third step, the flexible receiving polymer substrate 125 is formed into a cylinder and rolled over the PDMS applicator 105. Rolling the polymer substrate 125 over the PDMS applicator 105 transfers the carbon nanotubes to the polymer substrate 125 from the raised regions of the PDMS applicator 105. Once the solvent of the ink solution 115 dries, the carbon nanotubes reside on the top surface of the polymer substrate 125.

The conventional methods of solution-based carbon nanotube transfer described in relation to FIGS. 1 and 2 have many drawbacks and short comings. Significantly, the carbon nanotubes that are transferred to the polymer substrate are held to the substrate by only Van der Waals forces. Van der Waals forces are interatomic forces that cause an attraction between temporarily induced dipoles in nonpolar molecules and atoms because of asymmetrical distribution of electrons due to their movement. Van der Waals bonding is much weaker than both ionic and covalent bonding, and, in fact, Van der Waals forces are the weakest of the intermolecular forces. Thus, the carbon nanotubes residing on the substrate are fragile and very vulnerable to degradation or separation from the substrate. For example, the carbon nanotubes are easily separated from the surface of the substrate by an applied force, such as a scraping or twisting of the substrate. This vulnerability and weakness is contrary to the goal of providing a flexible, durable, and robust electronic device.

An additional problem with these conventional methods of transfer relates to the fact that they require an intermediate transfer step to a soft deformable template which may cause pattern replication issues for high density features. Furthermore, an additional problem with these conventional methods involves the lack of control over the orientation and arrangement of the carbon nanotubes. The suspension of the carbon nanotubes in an "ink," results in a loss of control over the orientation or arrangement of the carbon nanotubes. More specifically, the fabricator has no reliable or effective method by which to control the orientation or arrangement of the carbon nanotubes when the fabricator applies the ink to the PDMS applicator 105. As previously described, the erratic orientation and arrangement of the carbon nanotubes in the resulting device can be detrimental to the intended purposes of the device.

Similar problems exist for conventional methods of the transfer of nanomaterials other than carbon nanotubes to substrates, such as nanowires. Conventional methods of transfer do not enable the creation of flexible and durable substrates containing nanowires, and do not provide the fabricator with precise control over the layout of the nanowires.

Therefore, it is highly desired to enable a method for the creation of a flexible electronic device containing nanomaterials which are reliably in communication with the substrate. Furthermore, it is highly desired to enable a method for the creation of a flexible electronic device with nanomaterials patterned in a controlled arrangement.

Figure 3A:
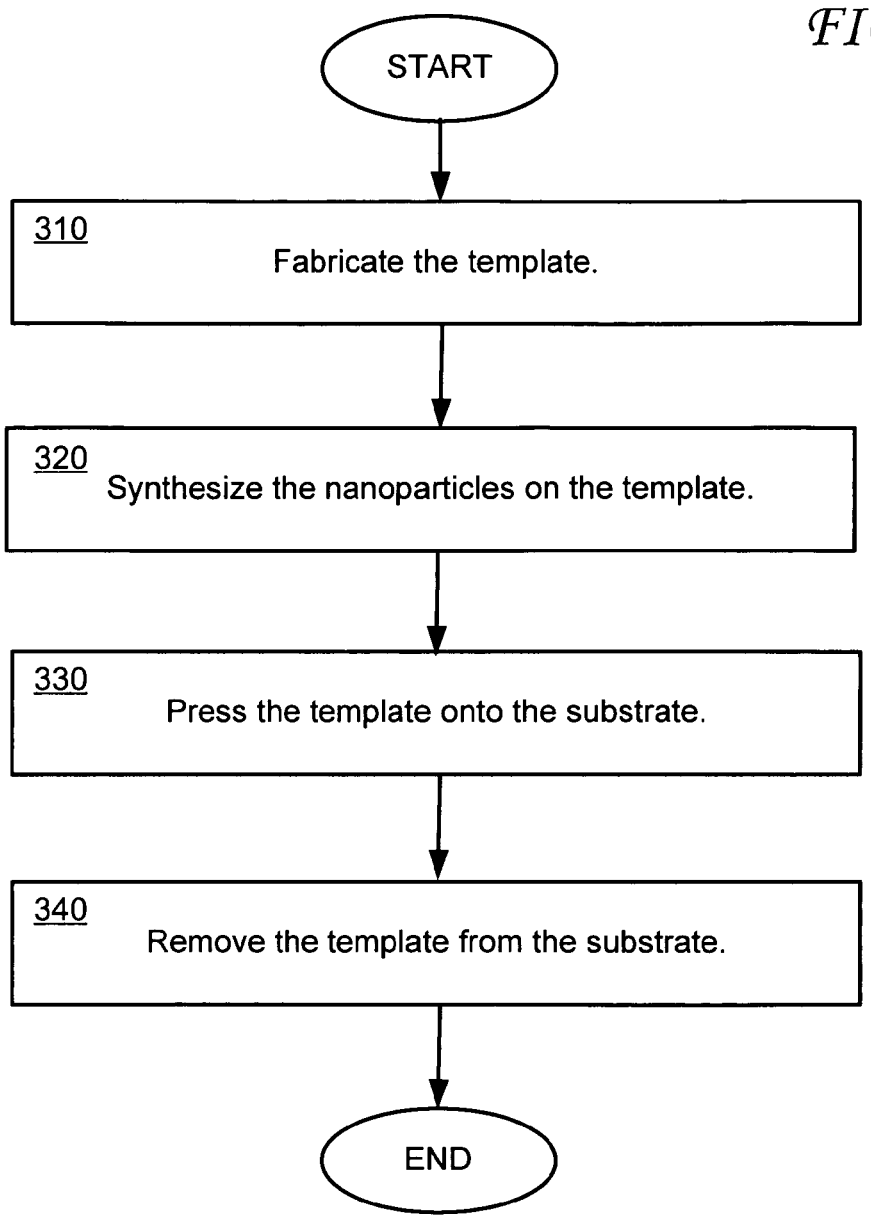
FIG. 3A is an illustration of a method of nanomaterial transfer in accordance with an exemplary embodiment of the present invention.

FIG. 3A is an illustration of a method of nanomaterial transfer in accordance with an exemplary embodiment of the present invention. As illustrated in FIG. 3A, the first step 310 of an embodiment of the method involves the fabrication of a template. In the second step 320, nanomaterials may be synthesized onto this template. The term synthesis is used herein to mean any method of providing for the growth, fabrication, or deposit of a nanomaterial. For example, and not limitation, synthesis may involve the growth of carbon nanotubes onto the template. In an alternate example, nanowires may be synthesized onto the template. In another example, nanowires could also be synthesized on the template by the process of suspension or deposition. The nanomaterials may be synthesized in the second step 320 in a manner that enables precise and controlled arrangement of the layout and orientation of the carbon nanotubes. Once the nanomaterials have been properly synthesized in the second step 320, the template may be ready for transfer. The transfer step 330 involves pressing the template onto a substrate. In the transfer step 330, the template may be pressed or embossed against the substrate. The action of pressing may involve placing a load on the template against the substrate for a predetermined period of time. In an exemplary embodiment, the transfer step 330 may be carried out at an elevated temperature. The final step 340 involves a removal of the template from the substrate. When the template is removed, the nanomaterials remain embedded in the substrate.

Figure 3B:
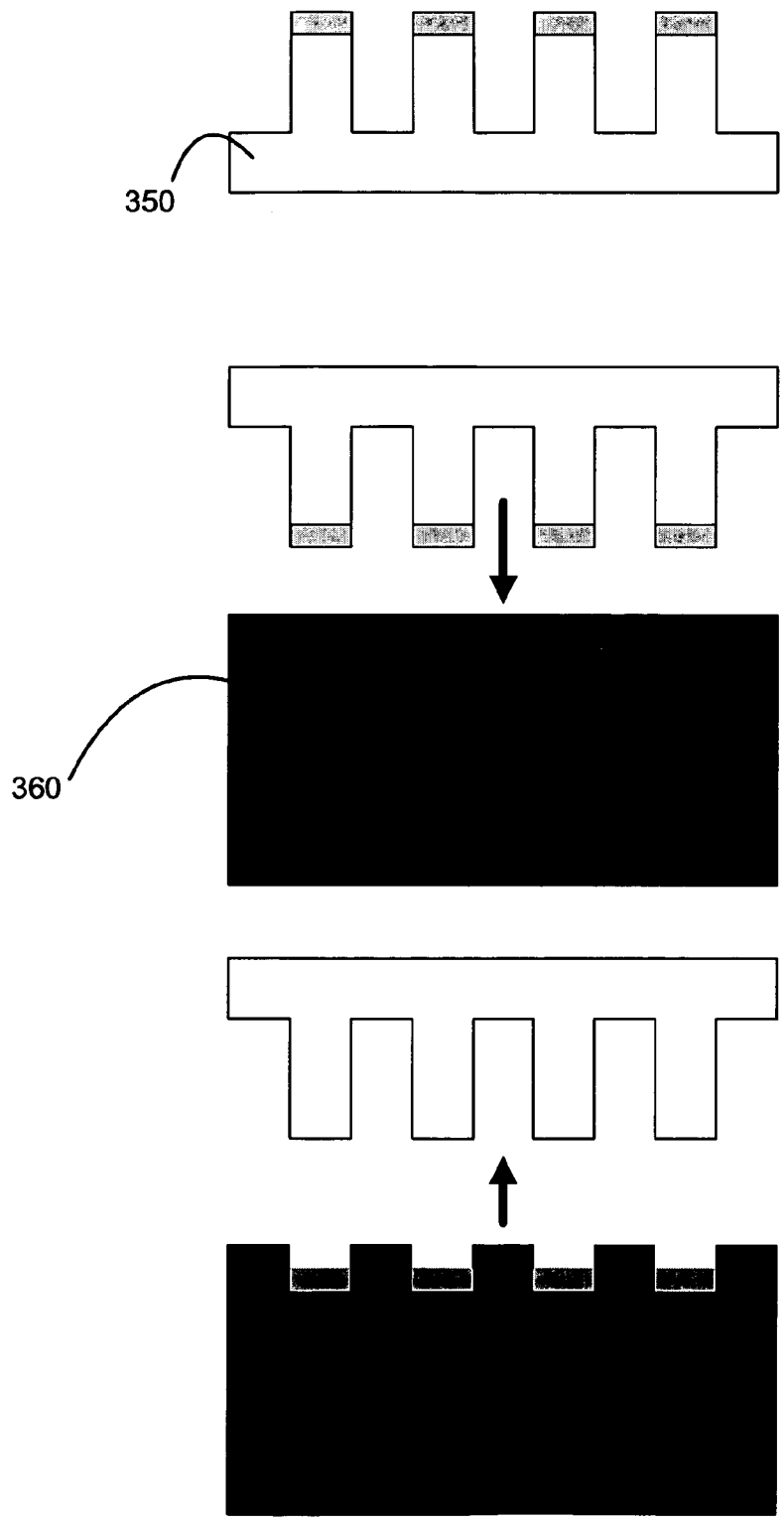
FIG. 3B is an illustration of an implementation of a method of nanomaterial transfer in accordance with an exemplary embodiment of the present invention.

FIG. 3B is an illustration of an implementation of a method of nanomaterial transfer in accordance with an exemplary embodiment of the present invention. As illustrated in FIG. 3B, the first step 310 (FIG. 3A) of the method may involve the fabrication of a template 350. In an exemplary embodiment, the template 350 may be a silicon master template. Nanomaterials may be synthesized on this master template. Once the nanomaterials have been properly synthesized in the second step 320 (FIG. 3A), the template 350 may be ready for transfer. The transfer step 330 (FIG. 3A) may involve pressing the template 350 onto a substrate 360. In an exemplary embodiment, the substrate 360 may be a polymer substrate. The polymer may be any type of flexible and durable thermoplastic polymer material. For example, and not limitation, in the exemplary embodiment, the substrate 360 is a polymethal methacrylate (PMMA). PMMA, commonly called acrylic, is the synthetic polymer of methyl methacrylate and exhibits many advantageous attributes for use in a flexible electronic device. PMMA has a low density, is lightweight, and most often transparent. PMMA may transmit more light than glass, does not filter UV light, and allows infrared light of up to 2800 nm wavelength to pass. Additionally, PMMA is easily formable at relatively low temperatures.

In another embodiment, the substrate 360 is paper. In other embodiments, the substrate 360 may be other types of materials, including low melting point metals, textile materials, any relatively soft materials, or other materials.

In the transfer step 330 (FIG. 3A), the template 350 is pressed against or embossed into the substrate 360. In an exemplary embodiment, the transfer step 330 may be carried out at an elevated temperature. For example, and not limitation, the template 350 may be placed in a hot press and the substrate 360 may be heated to a temperature in the range of 50 to 70 degrees Celsius. Once the proper temperature is obtained, the template 350 is pressed into the substrate 360.

The final step 340 (FIG. 3A) involves a removal of the template 350 from the substrate 360. When the template 350 is removed, the nanomaterials remain embedded in the substrate 360. As illustrated in FIG. 3, the nanomaterials may be deposited below the surface of the substrate 360. In the exemplary embodiment in which the transfer step 330 is performed at an elevated temperature, the substrate and embedded nanomaterials may be left to cool to room temperature after the removal 340 (FIG. 3A) of the template 350. In addition to added step of heating, those of skill in the art will appreciate that many additional steps could be added to the method of nanomaterial transfer as illustrated in FIG. 3. For example, and not limitation, the template 350 may be fabricated as a smooth silicon template or a microtextured silicon template.

As provided in reference to FIGS. 3A and 3B, the method of nanomaterial transfer is generally applicable to a majority of types of nanomaterials. While a portion of the description below pertains to embodiments involving carbon nanotubes, those of skill in art will recognize that the embodiments disclosed are mere examples of the overall concepts applicable to systems and methods for nanomaterials in general.

Figure 4:
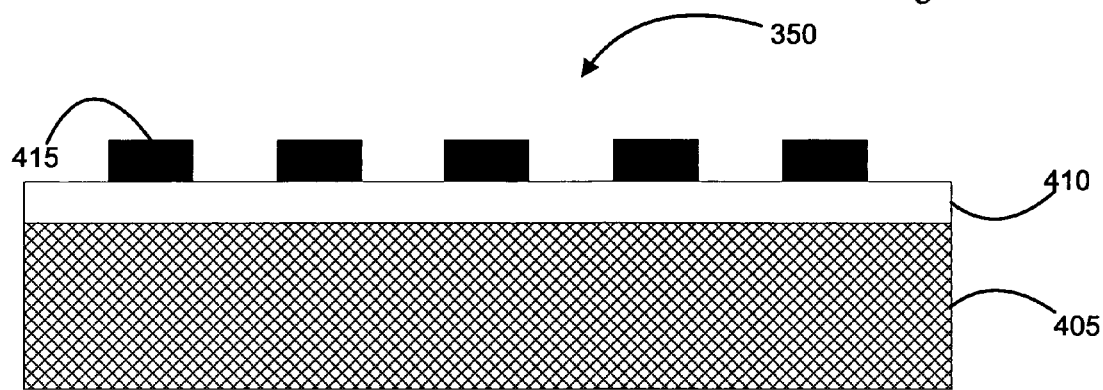
FIG. 4 is an illustration of a portion of a method of nanomaterial transfer in accordance with an exemplary embodiment of the present invention.
Figure 4:
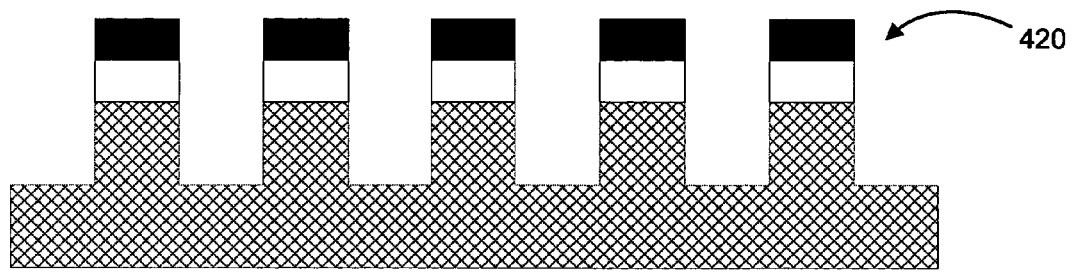
Figure 4:
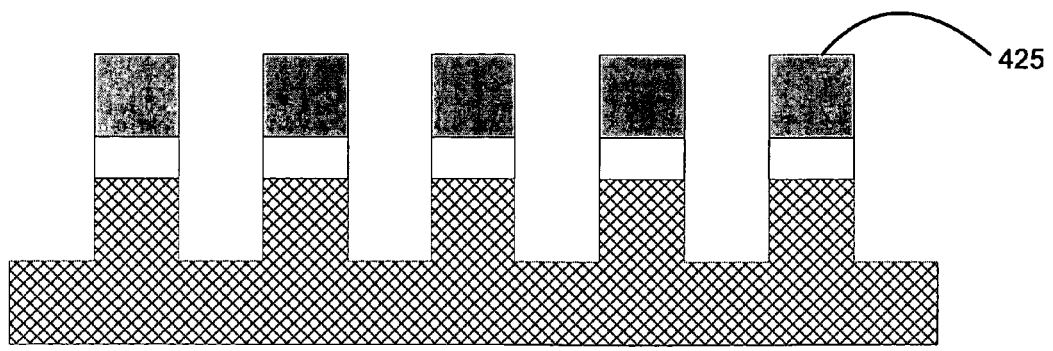

FIG. 4 is an illustration of a portion of a method of nanomaterial transfer in accordance with an exemplary embodiment of the present invention. Those of skill in the art will appreciate that FIG. 4, as with the rest of the figures provided, is not drawn to scale. The first step 310 (FIG. 3A) involves the fabrication of the template 350. In the exemplary embodiment depicted in FIG. 4, the template 350 is initially comprised of a microtextured silicon wafer 405. In another exemplary embodiment, the template 350 may be fabricated from a smooth silicon wafer 405. In one exemplary embodiment, the template 350 may be fabricated from a silicon wafer with a depth of 100 mm. Those of skill in the art will appreciate that the dimensions of the silicon wafer 405 can be altered without detracting from the scope of the invention.

Next, a silicon dioxide (SiO2) layer 410 may be grown on the silicon wafer 405 to support the subsequent thin film catalyst layer. This silicon dioxide layer 410 can be of any depth suitable for supporting the thin film catalyst layer. In the one exemplary embodiment, the silicon dioxide layer 410 is a 500 nm layer. Those of skill in the art will appreciate that the dimensions of the silicon dioxide layer 410 can be altered according to desired fabrication parameters without detracting from the scope of the invention.

After the creation of the silicon dioxide layer 410, the catalyst layer 415 may be fabricated. The catalyst layer 415 enables the synthesis of carbon nanotubes by the Chemical Vapor Deposition (CVD). The catalyst layer 415 may be comprised of any number of CVD compatible iron catalyst films, which are typically first row transition metals, including iron, nickel, and cobalt nanomaterials. The use of certain types of iron catalyst films has an effect upon the carbon nanotubes that are ultimately created. Thus, those of skill in art will appreciate that the makeup of the iron catalyst film may change in accordance with the desired outcome of the carbon nanotube synthesis process.

This catalyst layer 415 may be of any depth suitable for supporting the synthesis of carbon nanotubes. In the one exemplary embodiment, the catalyst layer 415 has a thickness of 10 nm. The catalyst layer 415 may be fabricated anywhere on the template 350 surface. The organized layout of the catalyst layer 415 will ultimately lead to the layout of the carbon nanotubes upon synthesis. Therefore, the arrangement and pattern of the carbon nanotube layout may be specifically controlled by the creation and arrangement of the catalyst layer 415 on the template 350. Areas of the template 350 that do not have the catalyst layer 415 will not support carbon nanotube growth during synthesis, and thus carbon nanotubes may not grow in these areas. Those of skill in the art will appreciate that the specific control over the precise arrangement and layout of the catalyst layer 415, provides the fabricator with specific control over the eventual layout of the carbon nanotube network. In some embodiments, the catalyst layer 415 may be comprised of patterned arrays of catalyst film. For example, and not limitation, that catalyst layer 415 may be comprised of iron catalyst patterned in 8 mm long and 10 µm line arrays with line pitch 10-500 µm.

For the microtextured silicon template 350 depicted in the embodiment shown in FIG. 3, the catalyst layer 415 is created through optical lithography and dry etching. The process of dry etching may involve reactive iron etching (RIE) and more specifically Bosch etching. The use of Bosch etching enables deep RIE to create almost vertical sidewalls in the template 350, with depths of over hundreds of microns. In an exemplary embodiment, the template mesas 420 are etched to a height of around 40 µm. Those of skill in the art will appreciate that the dimensions of the etching can be altered without detracting from the scope of the invention. Furthermore, the dimensions of the etched template mesas 420 will control, in part, the ultimate depth of penetration into the substrate 360. Therefore, different heights, widths, and lengths may be desired for different designs.

In an alternative embodiment, the silicon wafer 405 is smooth rather than microtextured. In the embodiments in which a smooth silicon wafer 405 is utilized, the iron catalyst film may be patterned on the silicon dioxide layer 410 by using contact photolithography and the lift-off technique. Those of skill in the art will appreciate, that any of the various forms of iron catalyst fabrication may be utilized without detracting from the scope of the invention.

The next step 320 (FIG. 3A) in the method of nanomaterial transfer involves the synthesis of the carbon nanotubes. In an exemplary embodiment, the template 350 is diced into squares. The squares can be of any suitable size. For example, the template 350 can be diced into 1 cm squares. The diced template 350 can then be placed into a high temperature CVD growth furnace. The CVD carbon nanotube growth process may involve preheating the template 350 to a temperature set point in the range of 500 to 1000 degrees Celsius. In an exemplary embodiment, the template 350 may be preheated to a temperature between 660 and 900 degrees. The template 350 may be preheated in a nonreactive environment in the CVD furnace. In some embodiments, this nonreactive environment may be comprised of Argon. Once the temperature set point is reached, the template 350 may be exposed to a gaseous carbon source. In an exemplary embodiment, the gaseous carbon source may be a mixture of acetylene, hydrogen, and methane. At the temperature set point, carbon atoms may be released by the energy source and diffuse toward the catalyst layer 415, thereby forming carbon nanotubes.

Those of skill in the art will appreciate that there are numerous variables in the CVD which can be adjusted, monitored, and maintained to control the various properties of the resulting carbon nanotubes. The temperature set point and the length of exposure can significantly modify the height and properties of the carbon nanotubes formed. In an exemplary embodiment, the synthesis period may be between 3 and 15 minutes. As illustrated in FIG. 4, the carbon nanotubes are synthesized on the top of the catalyst layer 415. The catalyst layer 415 may be arranged on the raised mesas 420 of the template 350. Thus, the carbon nanotubes 425 may be synthesized on the raised mesas of the template 350 where the catalyst layer 415 has been arranged. As positioned on the raised mesas 420 of the template 350, the carbon nanotubes 425 may be ready for transfer to the substrate 360.

Figure 5:
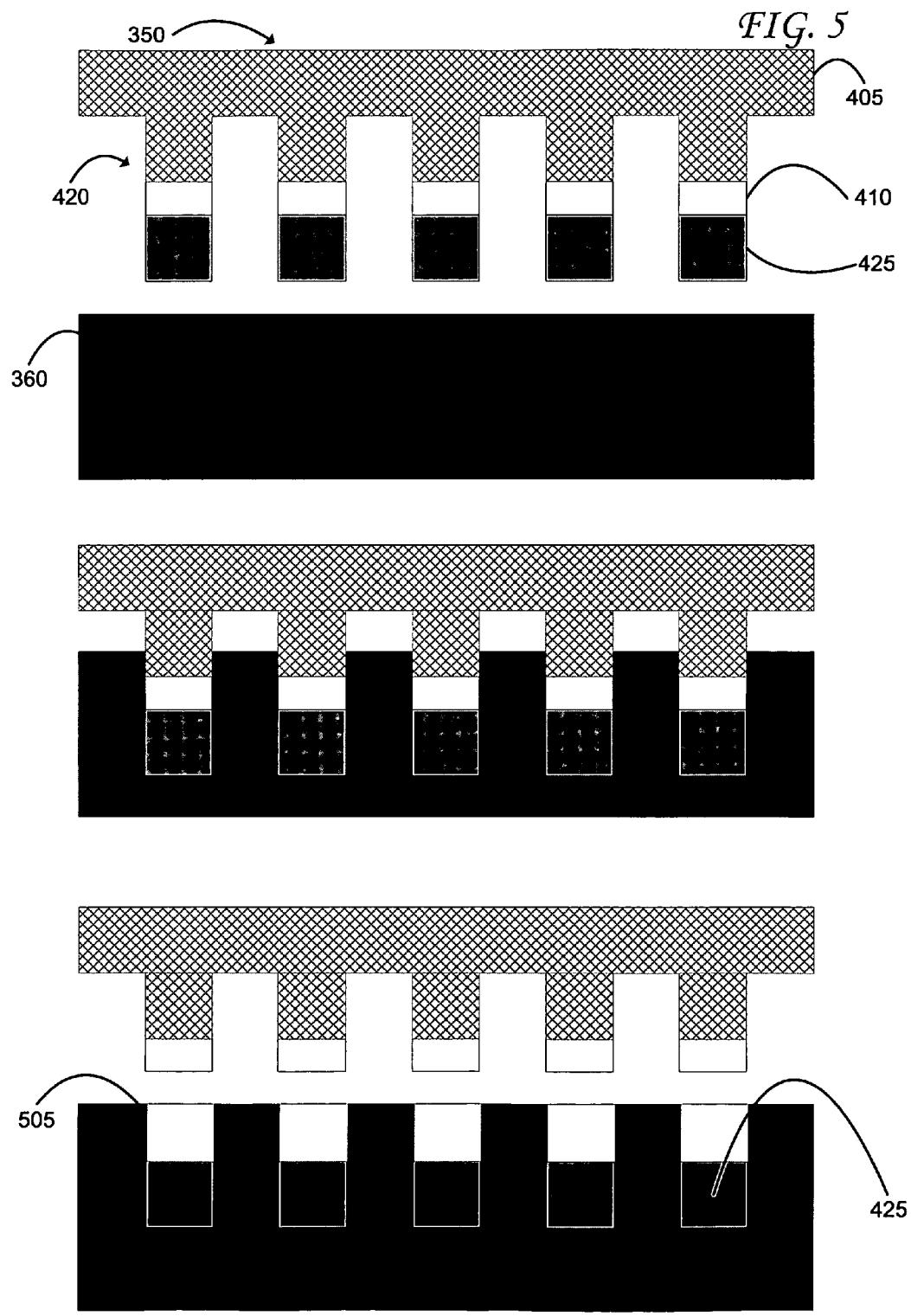
FIG. 5 is an illustration of a portion of a method of nanomaterial transfer in accordance with an exemplary embodiment of the present invention.

FIG. 5 is an illustration of a portion of a method of nanomaterial transfer in accordance with an exemplary embodiment of the present invention. Those of skill in the art will appreciate that FIG. 5, as with the rest of the figures provided, is not drawn to scale. After synthesis of the carbon nanotubes, step two 320 (FIG. 3A), the carbon nanotubes may be transferred to the substrate 360, step three 330 (FIG. 3A). As previously described, the substrate 360 may be a variety to different types of materials, including a polymer. In the exemplary embodiment, the substrate 360 is a PMMA. The transfer step three 330 (FIG. 3A) involves pressing the template 350 into the substrate 360. In one embodiment, a load is applied to the template 350, such that it is pressed into the substrate 360. The PMMA can be of varying dimensions, according to the demands of the application. In an exemplary embodiment, the PMMA is a 15 mm square substrate. Those of skill in the art will appreciate that the dimensions of the substrate 360 can be varied for different applications, such as a thicker substrate 360 when less flexibility is needed or a thinner substrate 360 when greater flexibility is desired. Once a load has been applied to press the template 350 into the substrate 360, the template 350 may be removed in accordance with the final step 340 (FIG. 3A). The action of pressing the template 350 into the substrate 360 may cause the carbon nanotubes 425 to be deposited within the substrate 360. As illustrated in FIG. 5, once the template 350 is removed from the substrate 360, the carbon nanotubes 425 may remain embedded within the substrate 360. Furthermore, as illustrated in FIG. 5, for some embodiments of the present invention the action of pressing may embed the carbon nanotubes 425 below the surface layer 505 of the substrate 360.

Once the template 350 is removed, the resulting device containing the carbon nanotubes 425 embedded into the substrate 360 is complete. Unlike conventional methods of nanomaterial transfer, the method of nanomaterial transfer of the present invention does not require further processing after the transfer of the carbon nanotubes 425. Therefore, upon removal of the template 350, the device may ready to be further processed into a flexible electronic device or other component.

An embodiment of the method of nanomaterial transfer of the present invention may enable the fabricator to securely embed the carbon nanotubes 425 into the substrate 360, thus the carbon nanotubes 425 are not fragile and subject to separation. The fabricator may control the depth of the insertion of carbon nanotubes 425 by controlling the height of the template mesas 420 and the force applied to the template 350 and the substrate 360 when the template 350 is pressed to the substrate 360. Furthermore, the method of nanomaterial transfer of the present invention enables the fabricator to have intricate control over the creation of the material and the characteristics of the resulting structure. The method of the present invention enables the creation of a flexible electronic device with well controlled dense patterns of carbon nanotubes and also may allow the creation of either a random orientation or a generally vertical alignment. The term generally vertical alignment and generally vertical orientation are used synonymously herein to describe a layout of the carbon nanotubes in which they are generally parallel to each other. In relation to the illustration of FIG. 5, the carbon nanotube would be in a vertical position relative to the substrate. Those of skill in the art will appreciate, however, that overall position of the carbon nanotube group could change from vertical to horizontal while the carbon nanotubes remain generally parallel to each other.

An implementation of the method of nanomaterial transfer of the present invention enables nanotubes feature heights and aspect ratios that are not achievable with conventional methods. The flexible electronic devices created by embodiments of the method of the present invention may have feature heights between 5 to 100 μm. Furthermore, the aspect ratios of the carbon nanotubes patterns may be as high as 7:1.

Some flexible electronic device applications require a high aspect ratios, while others may be require a low aspect ratio. For example, and not limitation, if high on-off ratios are desired for an implementation, then a high aspect ratios will not be desired. High on-off ratios are characteristic of random networks of short nanotubes with a lower density. Alternatively, certain implementations require a high aspect ratios. For example, and not limitation, a carbon nanotube material may be used as a heat dissipation structure. As certain carbon nanotubes structures exhibit excellent thermal conductivity, arguably the best thermal conductivity of any known structure, it is highly desired to use carbon nanotube materials in thermal dissipation implementations. One embodiment uses the carbon nanotubes material as a heat sink for electronics device. As the density and heat generation of electronic circuits increases with the advancements in technology, so does the desire for materials capable of dissipating this heat. For thermal conductivity applications, it is desired to have a densely packed network of carbon nanotubes with a high aspect ratio. Thus, the carbon nanotubes material of the present invention exhibiting an aspect ratio of 7:1 are highly advantageous for thermal dissipation applications.

In other flexible electronic device applications it is desired to have at least one end surface of the carbon nanotube exposed. For example, this is important in applications where the device is implemented as a Field Emission Display ("FED") device. The open end surface permits the electrons to exit the carbon nanotube and pass over a near-vacuum gap or other dielectric.

Another promising application of the flexible electronic devices created in accordance with the present invention involves the creation of multi-layer devices. Once a single layer flexible electronic device has been created in accordance with the present invention it can be assimilate with other similarly created single layer flexible electronic devices. Predetermined circuit design and layout may establish the interconnectivity of the circuits between layers and allow for the creation of sophisticated and complex multi-layer electronic circuitry.

Figure 6:
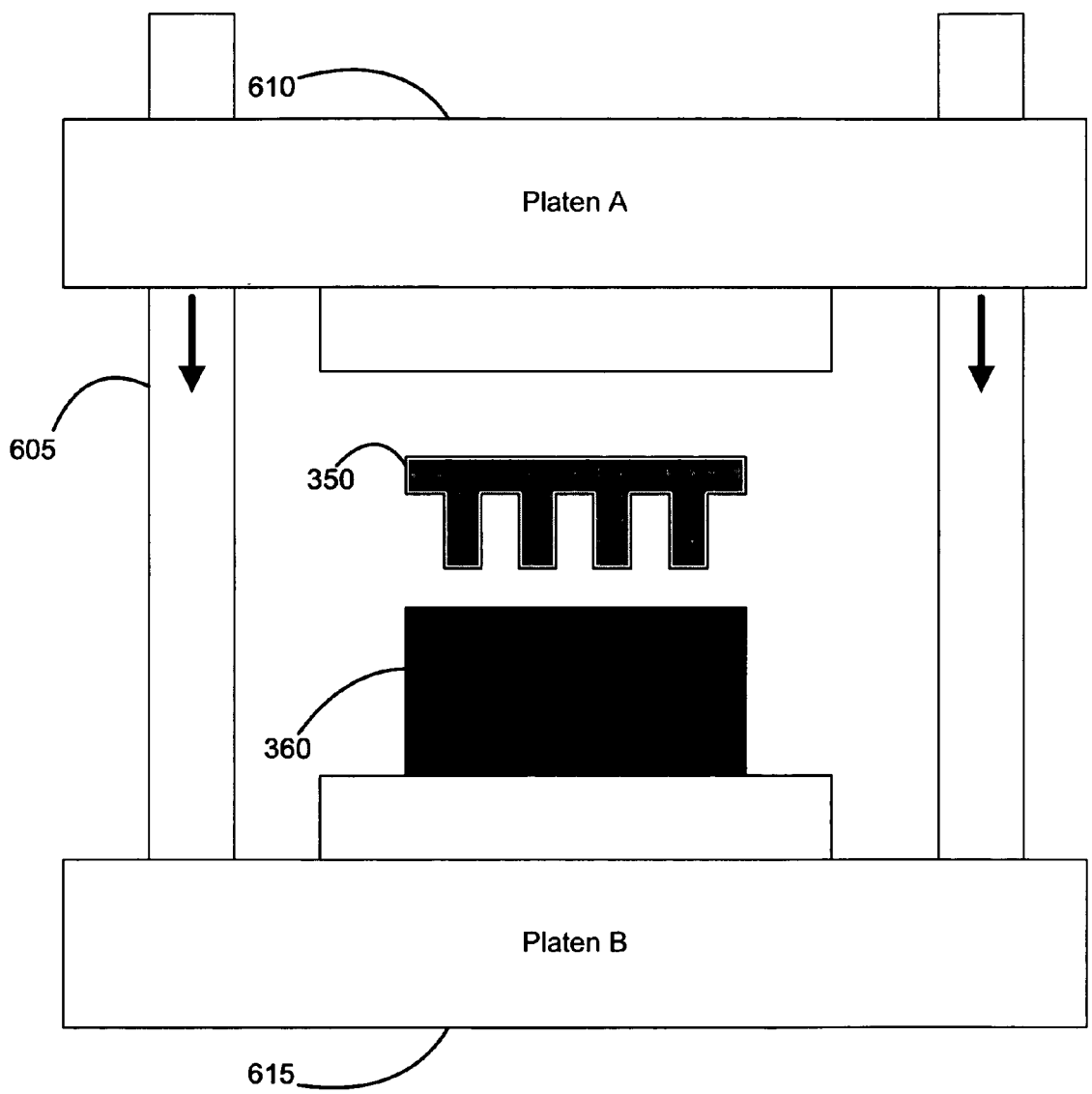
FIG. 6 is an illustration of a portion of a method of nanomaterial transfer in accordance with an exemplary embodiment of the present invention.

FIG. 6 is an illustration of a portion of a method of nanomaterial transfer in accordance with an exemplary embodiment of the present invention. In an exemplary embodiment of the present invention, the step of transferring 330 (FIG. 3A) the nanomaterials to the substrate 360 can further involve elevating the temperature of all or certain elements involved in the process, such as the template 350 and substrate 360. The exemplary embodiment depicted in the FIG. 6, is an example of method of transferring the nanomaterial in which the step of global heating is performed, in which a majority of elements may be heated prior to transfer. As shown in FIG. 6, a standard press 605 may be used to apply the necessary load for the transfer of the nanomaterials. In an exemplary embodiment, the standard press 605 has two platens, Platen A 610 and Platen B 615, which may be used to apply the necessary load to the template 350 and the substrate 360. The press 605 may be operated such that the Platen A 610 is lowered down in the direction of the Platen B 615 until the necessary load is applied against the template 350 to force it against the substrate 360. In addition to providing the necessary load, the press 605 may provide the thermal energy necessary to elevate the temperatures of the both the substrate 360 and the template 350 prior to transfer. The press 605 may enable the fabricator to set a temperature for Platen A 610 and temperature for Platen B 615. By raising the temperature of Platen A 610 and Platen B 615, the temperatures of both the substrate 360 and the template 350 may be elevated.

In one embodiment, the temperatures of Platen A 610 and Platen B 615 are set at the glass transition temperature of the substrate. The glass transition temperature, $T_g$, is the temperature below which molecules have little relative mobility. For example, and not limitation, in an embodiment in which the substrate 360 is PMMA, both the PMMA substrate 360 and template 350 may be heated to a temperature in the range of 110 to 120 degrees Celsius. Those of skill in the art will appreciate that the $T_g$ of the substrate 360 can vary, thus requiring variation in the appropriate heating temperature. Additionally, it may be desired to have high relative mobility in a substrate 360 prior to transfer for one application and low relative mobility in a substrate 360 for another application. This method of global heating can also be referred to as hot embossing.

The heating of the elements of the process allows for variations in the insertion of the nanomaterials. In one non-limiting example, the heating of the substrate 360 to a transition temperature may allow for easy deformation of the substrate 360 and easy acceptance of the embedded nanomaterials. Therefore, the elevation of the template 350 and substrate 360 temperatures may allow for more effective transfer of the nanomaterials into the substrate 360.

In an alternative embodiment of the present invention, the substrate 360 is a low melting point metal. The press 605 may be used to apply thermal energy to the low melting point metal such that it reaches a temperature at which nanomaterial may be transferred into the metal in accordance with an embodiment of the method of nanomaterial transfer of the present invention.

Figure 7:
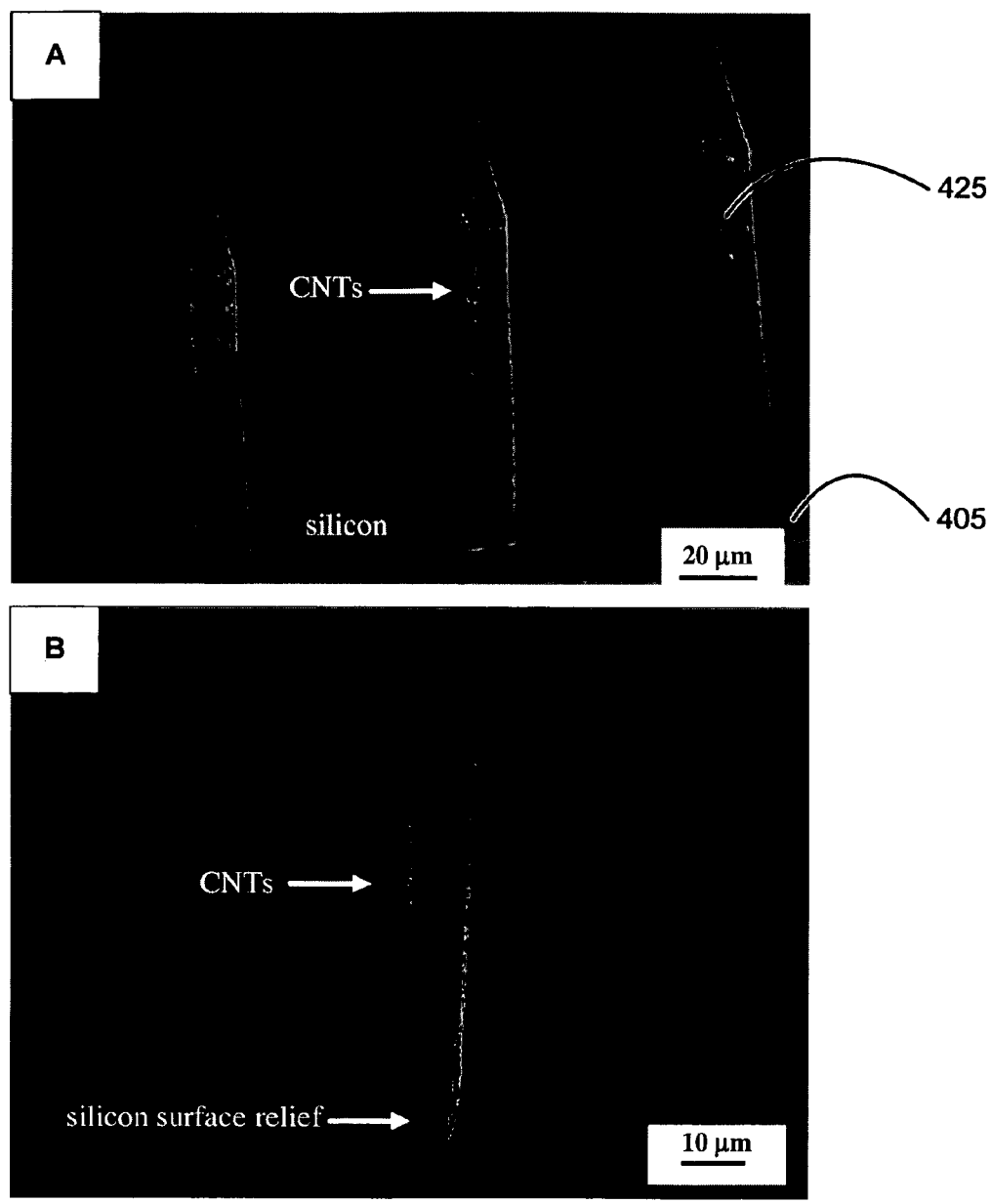
FIGS. 7A and 7B depict a template in accordance with an exemplary embodiment of the present invention.

FIGS. 7A and 7B depict a template in accordance with an exemplary embodiment of the present invention. As shown in FIGS. 7A and 7B, the carbon nanotubes may be synthesized on the silicon base with an exceptionally high aspect ratio. FIG. 7A shows carbon nanotubes 425 synthesized on a smooth silicon wafer 405 in accordance with one embodiment of the present invention. FIG. 7B shows carbon nanotubes 425 synthesized on a microtextured silicon wafer 405 in accordance with one embodiment of the present invention. The neat and organized characteristics of the carbon nanotubes shown in FIGS. 7A and 7B exhibit the intricate precision the fabricator has over the layout of the carbon nanotubes by using the method of the present invention. FIGS. 7A and 7B also illustrate the vertical alignment of the carbon nanotubes 425 synthesized on the template 350.

Figure 8:
FIGS. 8A, 8B, and 8C depict a flexible electronic device in accordance with an exemplary embodiment of the present invention.
Figure 8:
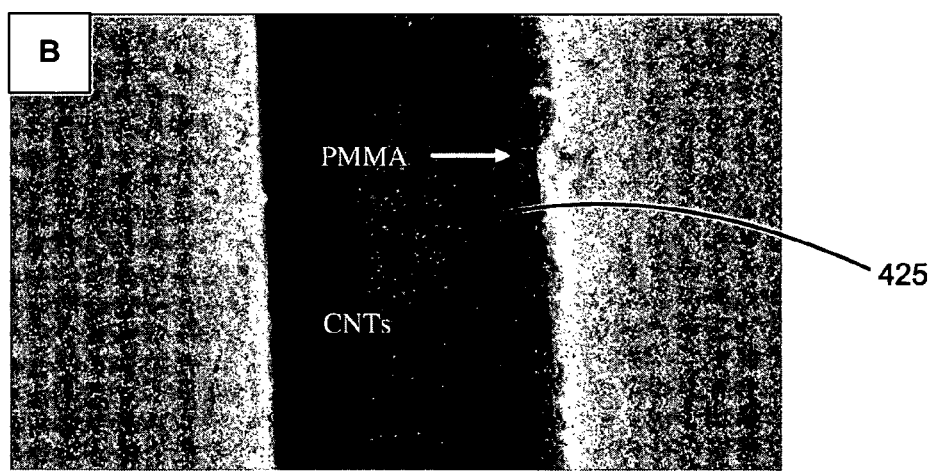
Figure 8:
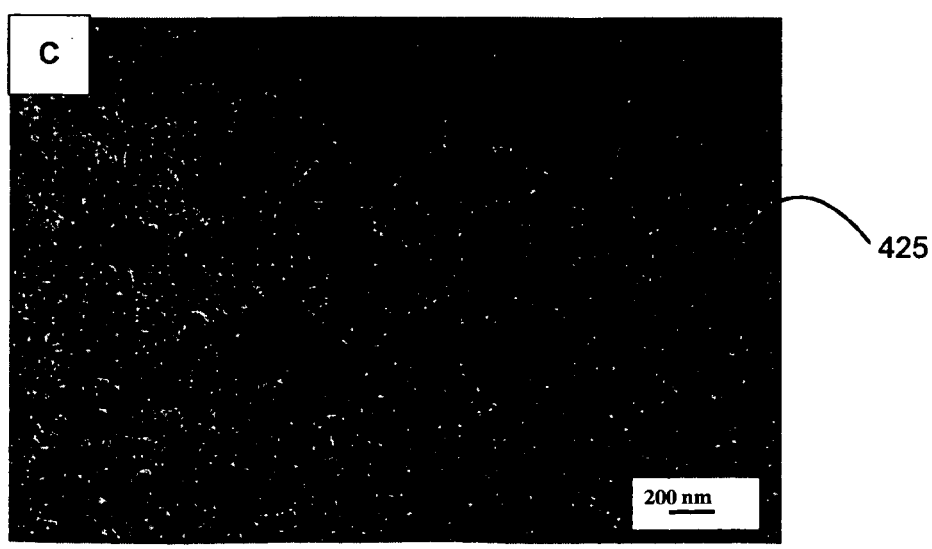

FIGS. 8A, 8B, and 8C depict a flexible electronic device in accordance with an exemplary embodiment of the present invention. As shown in FIG. 8A, the carbon nanotubes 425 form a well patterned array of traces on the polymer substrate 360. In some embodiments, the pattern of the traces, as illustrated in FIG. 8A, may create the circuit diagram for the electronic device enabled by the nanomaterial transfer. FIG. 8B shows carbon nanotubes 425 after transfer to the PMMA substrate 360. FIG. 8B illustrates embedded nature of the carbon nanotube 425 position. As shown in FIG. 8B, the carbon nanotubes 425 are positioned below the surface layer of the PMMA polymer substrate 360. The embedded nature of the carbon nanotubes 425 provides many significant advantages. One highly desired advantage is that the carbon nanotubes 425 are not fragile or subject to separation from the substrate 360. One of intended purposes of a flexible electronic device is to be able to withstand mechanical forces without degradation to the circuit. More particularly, it is not desired for the carbon nanotubes 425 to separate from the substrate 360 when the flexible electronic device is deformed. Unlike the conventional systems in which the carbon nanotubes could be easily scraped from the substrate 360 surface, the embedded carbon nanotubes 425 shown in FIG. 8B may not be easily removed by a scraping force. Additionally, when forces are applied to the flexible electronic device the embedded carbon nanotubes are unlikely to be compromised.

FIG. 8C is an illustration of the layout of the carbon nanotubes 425 at the nanometer level. From this perspective, the arrangement of the carbon nanotubes 425 within the substrate 360 can be observed. As shown in FIG. 8c, the carbon nanotubes 425 embedded in the substrate 360 are arranged in a random layout. This random orientation of the carbon nanotubes 425 is advantageous and desired for some applications. For example, random orientation may be preferred for certain flexible electronic devices in which high on-off transistor ratios are desired. To achieve this random orientation, the step of global heating, described above in relation to FIG. 6, may be executed. Therefore, when both the template 350 and the substrate 360 are heated in a device, such as the press 605, prior to transfer, the end result may be a network of carbon nanotubes 425 in random orientation in the substrate 360, as shown in FIG. 8C. Those of skill in the art will appreciate that it is only the orientation of the carbon nanotubes 425 that is random. The fabricator retains precise control over the arrangement of the traces made up by the carbon nanotubes 425 on the substrate 360, yet the orientation of carbon nanotubes 425 within those traces is random.

Figure 9:
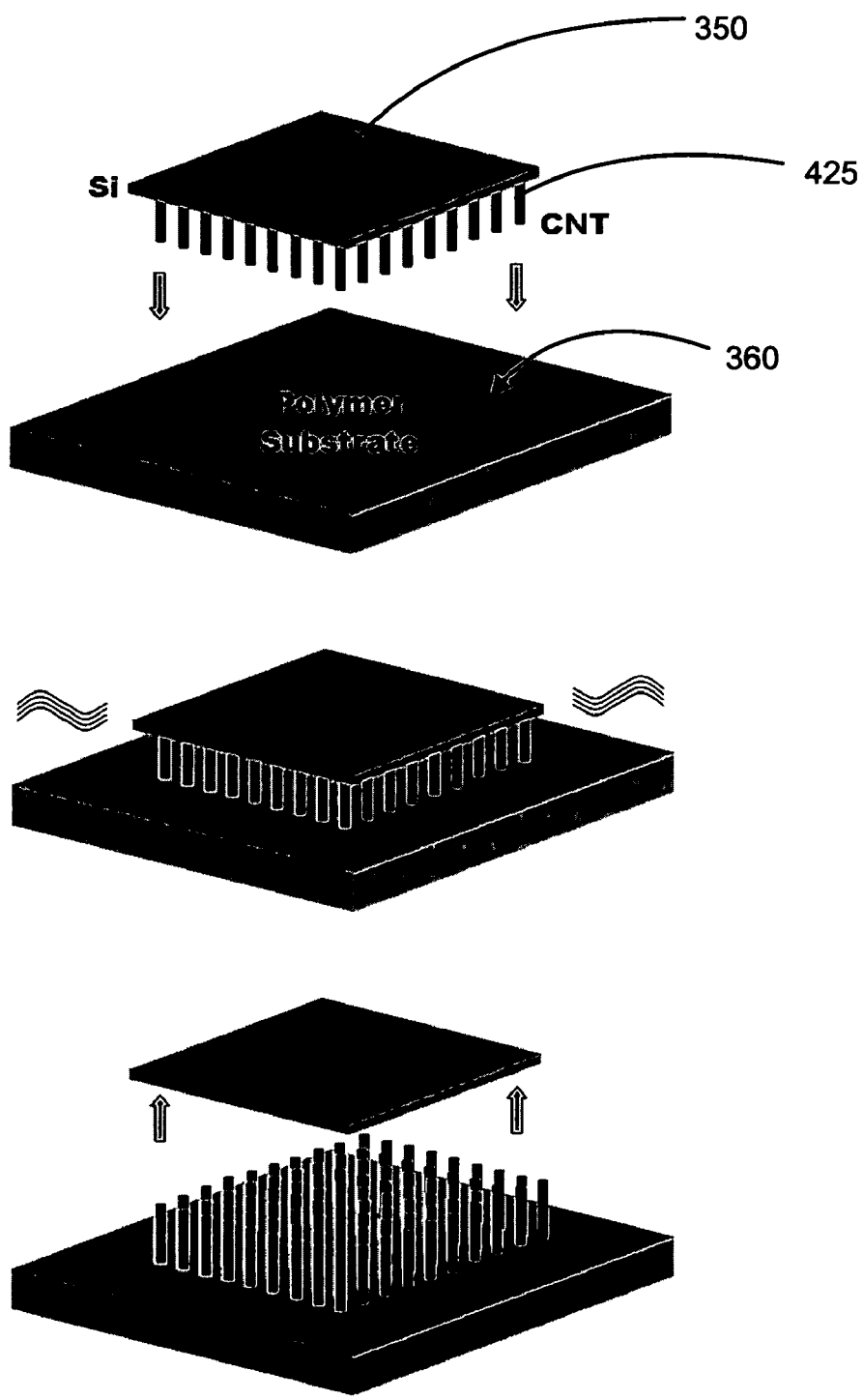
FIG. 9 is an illustration of a portion of a method of nanomaterial transfer in accordance with an exemplary embodiment of the present invention.

FIG. 9 is an illustration of a portion of a method of nanomaterial transfer in accordance with an exemplary embodiment of the present invention. The exemplary embodiment depicted in FIG. 9 illustrates a step in an embodiment of the method of nanomaterial transfer of the present invention that enables the fabricator to retain control over not only of the precise arrangement of the carbon nanotubes 425, but their the resulting orientation in the substrate 360. The step illustrated in FIG. 9 involves localized heating. More particularly, unlike of the process of global heating, described in relation to FIG. 6, the method of nanomaterial transfer as illustrated in FIG. 9 may involve heating particular elements of the process. For global heating a majority of the elements residing on the template 350 and the substrate 360 may be heated prior to transfer. For localized heating, in an exemplary embodiment, only the certain elements are heated. This may be accomplished by the application of a microwave energy field prior to and during the transfer of the carbon nanotubes 425 to the substrate 360. The application of a microwave energy field may be used to raise the temperature of the carbon nanotubes 425 without raising the temperature of the substrate 360.

In an exemplary embodiment, the substrate 360 is a polymer. Thus, when microwave energy is applied to both the substrate 360 and the template 350 containing the carbon nanotubes 425, the overall temperature of the of the substrate 360 may remain relatively constant. When the temperature of the carbon nanotubes 425 is elevated by the microwave energy, prior to being forced against the substrate 360, the carbon nanotubes 425 may more easily be embedded into the substrate 360 when a force is applied. Upon application of a force on the template 350 against the substrate 360, the relatively high temperature of the carbon nanotubes 425 subject to the microwave energy may heat the substrate 360 in the very localized area of the heated carbon nanotubes 425. Similar to an analogy of a hot knife through butter, the carbon nanotubes 425 may heat the substrate 360 immediately surrounding them and be easily embedded into that substrate 360.

In an exemplary embodiment, in which the step of localized heating is performed, the load force necessary to carry out compression of the template 350 onto the substrate 360 may be simply the weight of the template 350. In another embodiment a press 605 (FIG. 6) can be utilized to apply a load between the template 350 and substrate 360.

The step of localized heating may permit precise and intricate control over the orientation of the carbon nanotubes 425. Significantly, the carbon nanotubes 425 may be embedded in the substrate 360 in a generally vertical fashion. This vertical, or generally parallel, orientation of the carbon nanotubes 425 is unachievable with prior art methods of nanomaterial transfer. This vertical orientation is highly desired for many carbon nanotube based applications. For example, and not limitation, the vertical orientation of the carbon nanotubes 425 is highly desired for FED devices.

To achieve a flexible electronic device to be used for FED device purposes, it is believed to be advantageous to have generally vertically aligned carbon nanotubes. The step of localized heating in an exemplary embodiment of the method of nanomaterial transfer of the present invention may enable this generally vertically orientation of the carbon nanotubes 425 in the substrate 360, as shown in FIG. 9. In addition to vertical alignment, it is highly desired for some applications for the ends of carbon nanotubes 425 to be exposed at the top of the structure. As illustrated in FIG. 9, the carbon nanotubes 425 in the resulting flexible electronic device are exposed at the top.

Figure 10:
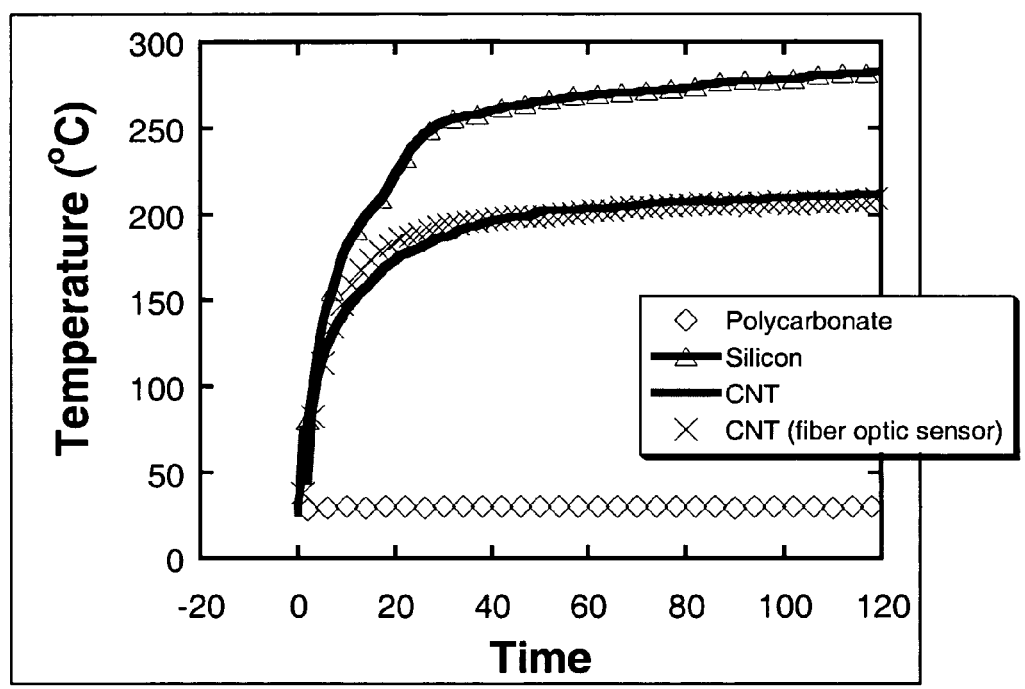
FIG. 10 is an illustration of a temperature chart of the various elements during the step of localized heating in accordance with an exemplary embodiment of the present invention.

FIG. 10 is an illustration of a temperature chart of the various elements during the step of localized heating in accordance with an exemplary embodiment of the present invention. As shown in FIG. 10, when both the template 350 and the substrate 360 are exposed to microwave energy in the step of localized heating, the substrate 360 may remain at a relatively constant temperature. In the embodiment used to produce the date illustrated in the chart in FIG. 10, the substrate 360 is a polycarbonate. As shown by the temperature graph, the temperature of the carbon nanotubes 425 increases when exposed to microwave energy, while the temperature of the polycarbonate substrate 360 remains the same.

Figure 11:
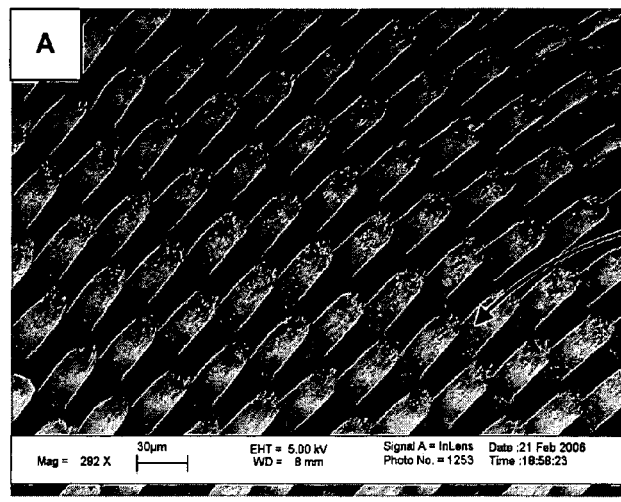
FIGS. 11A, 11B, and 11C depict various stages of a method of nanomaterial transfer in accordance with an exemplary embodiment of the present invention.
Figure 11:
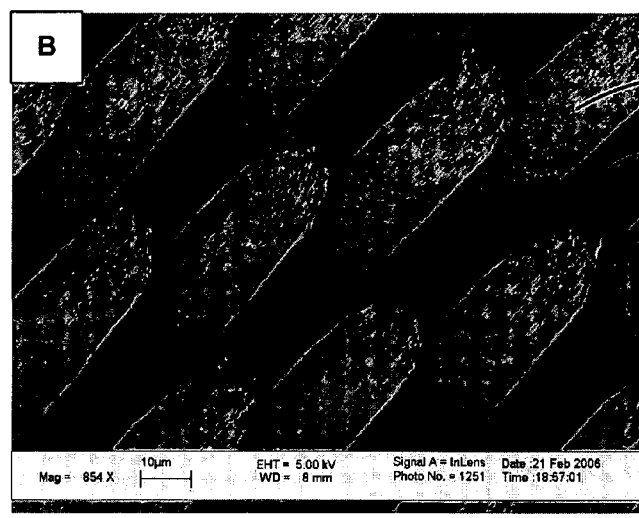
Figure 11:
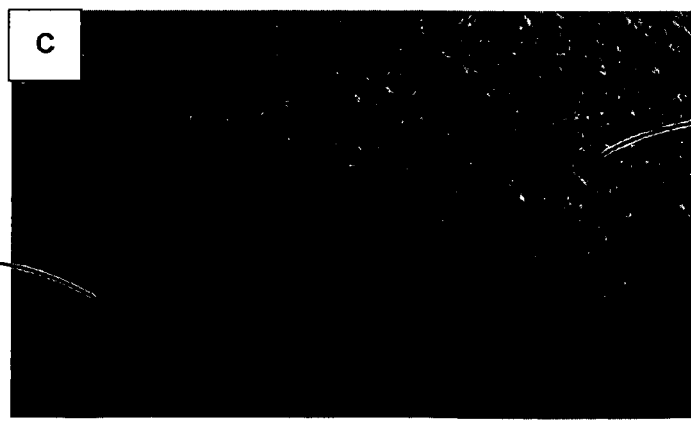

FIGS. 11A, 11B, and 11C depict various stages of a method of nanomaterial transfer in accordance with an exemplary embodiment of the present invention. As show in FIGS. 11A and 11B, the template 350 is comprised of carbon nanotubes 425 synthesized on the silicon wafer 405 and these carbon nanotubes 425 are generally vertically aligned. FIG. 11C is an illustration of the carbon nanotubes 425 after transfer to the substrate 360. As shown in FIG. 11C, the carbon nanotubes 425 are generally vertically aligned after transfer to the substrate 360. The smooth and organized characteristics of the carbon nanotubes shown in FIG. 11 exhibit the intricate precision the fabricator has over the layout of the carbon nanotubes by using the method of the present invention.

Figure 12:
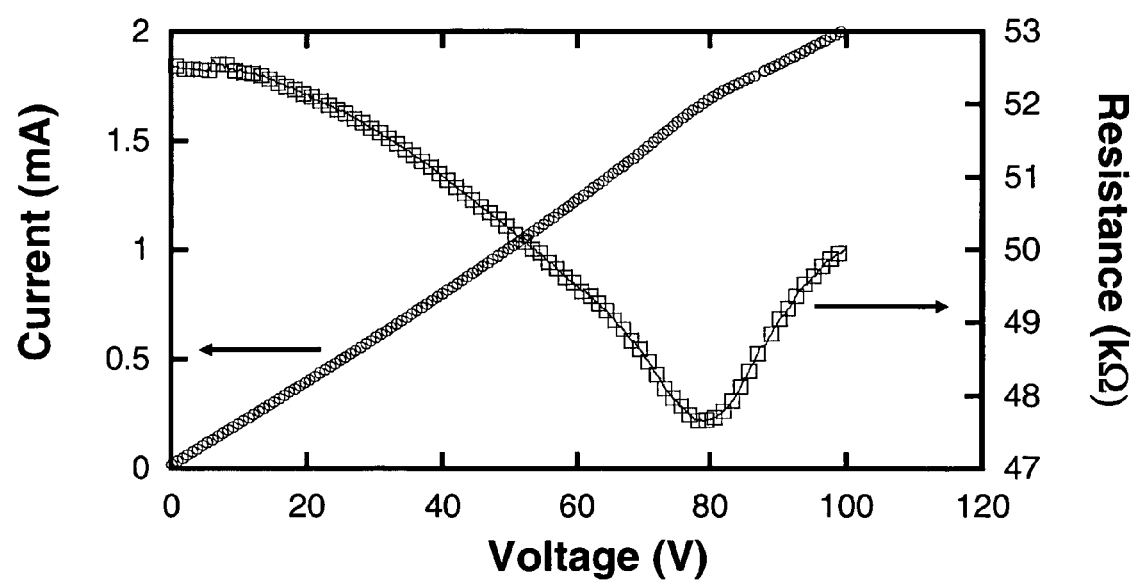
FIG. 12 is an illustration of a current to voltage chart and a resistance to voltage chart for a flexible electronic device in accordance with an exemplary embodiment of the present invention.

FIG. 12 is an illustration of a current to voltage chart and a resistance to voltage chart for a flexible electronic device in accordance with an exemplary embodiment of the present invention. The chart provided in FIG. 12 represents data results obtained from a single trace on a flexible electronic device of the present invention. In other words, the data was obtained from one trace, or one line, such as the trace illustrated in FIG. 8B. The generally ascending line on the chart of FIG. 12 represents the current to voltage relationship for a flexible electronic device in accordance with the present invention, while the generally descending line represents the resistance to voltage relationship for the device. As illustrated in FIG. 12, the current to voltage response may be linear up to around 30 volts. The data shown in the chart of FIG. 12 depicts the low power requirements of a circuit in which flexible electronic devices of the present invention are implemented. For example, and not limitation, a flexible electronic device in accordance with the present invention may use a very low current, under 500 μA, when it is operated at voltages at or below 30 volts. The low current requirements of a flexible electronic device in accordance with the present invention are extraordinary when compared to the conventional devices.

Furthermore, the resistance for the trace represented in FIG. 12 ranges from 52 kΩ at zero volts to 47.5 kΩ at eighty volts. Generally, sample resistances for flexible electronic devices in accordance with the present invention range from 1 kΩ to 9 MΩ. Furthermore, resistances for flexible electronic devices in accordance with the present invention generally decrease with carbon nanotube length.

Figure 13:
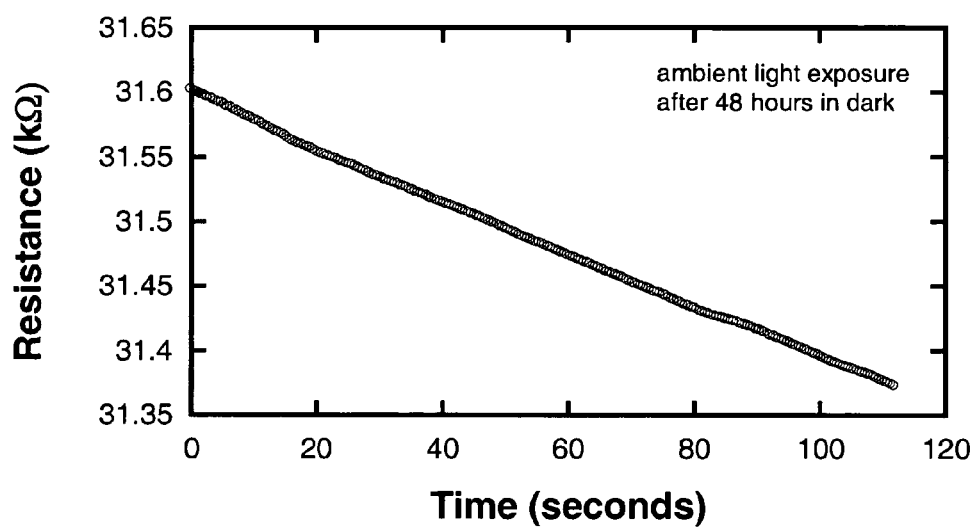
FIG. 13 is an illustration of a resistance chart for a flexible electronic device in accordance with an exemplary embodiment of the present invention.

FIG. 13 is an illustration of a resistance chart for a flexible electronic device in accordance with an exemplary embodiment of the present invention. Flexible electronic devices containing carbon nanotubes in accordance with the present invention present significant advantages to applications involving optical sensors. As previously discussed, every atom in carbon nanotube is on the surface, thus it is incredibly sensitive to the environment, and small changes in the environment may drastically change the electrical properties of the carbon nanotube. Therefore, a flexible electronic device made up of carbon nanotubes may be incredibly sensitive to minute changes in the charge environment which may be attributed to certain levels of light exposure. The chart provided in FIG. 13, illustrates change in the resistance value of a carbon nanotube enabled circuit in a flexible electronic device in accordance with the present invention. The data illustrated in FIG. 13 was obtained from measurements taken from a flexible electronic device in accordance with the present invention exposed to ambient light after 48 hours in the dark. As shown, the resistance drops 50Ω in the first 20 seconds of light exposure, from 31.6 kΩ to 31.55 kΩ. Over the entire sequence of 120 seconds of light exposure, the resistance drops 250Ω, from 31.6 kΩ to 31.35 kΩ.

Figure 14:
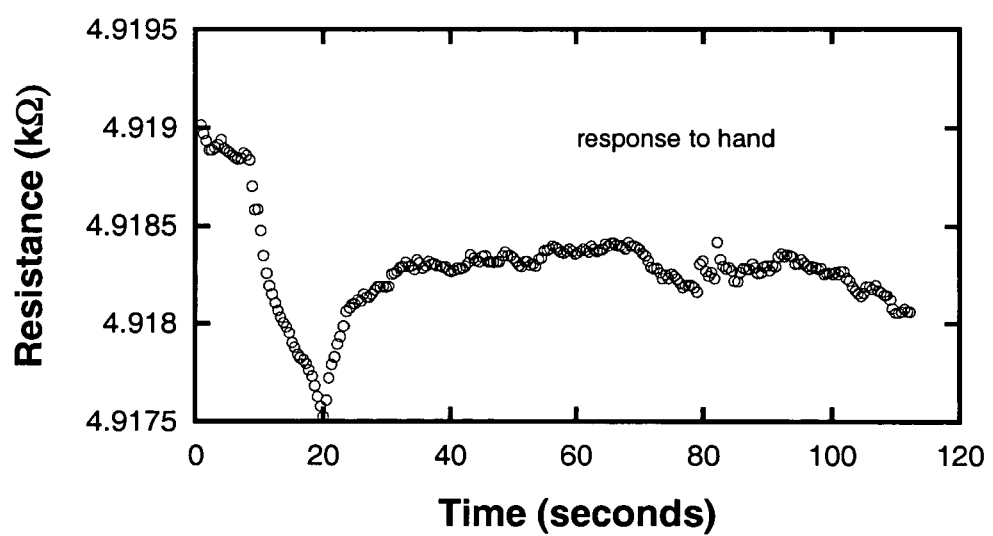
FIG. 14 is a chart of data obtained from an optical detection application for a flexible electronic device in accordance with an exemplary embodiment of the present invention.

FIG. 14 is a chart of data obtained from an optical detection application for a flexible electronic device in accordance with an exemplary embodiment of the present invention. The chart shown in FIG. 14 provides a resistance curve for a flexible electronic device in accordance with the present invention when exposed to hand movement. The high sensitivity to light of the carbon nanotubes contained in the flexible electronic device in accordance with the present invention is illustrated in FIG. 10. When the flexible electronic device was exposed to hand movement, the resistance of the carbon nanotube circuits may be measurably changed. As shown, in 20 seconds the resistance dropped 2.5Ω, from 4.919 kΩ to 4.9175 kΩ.

Figure 15:
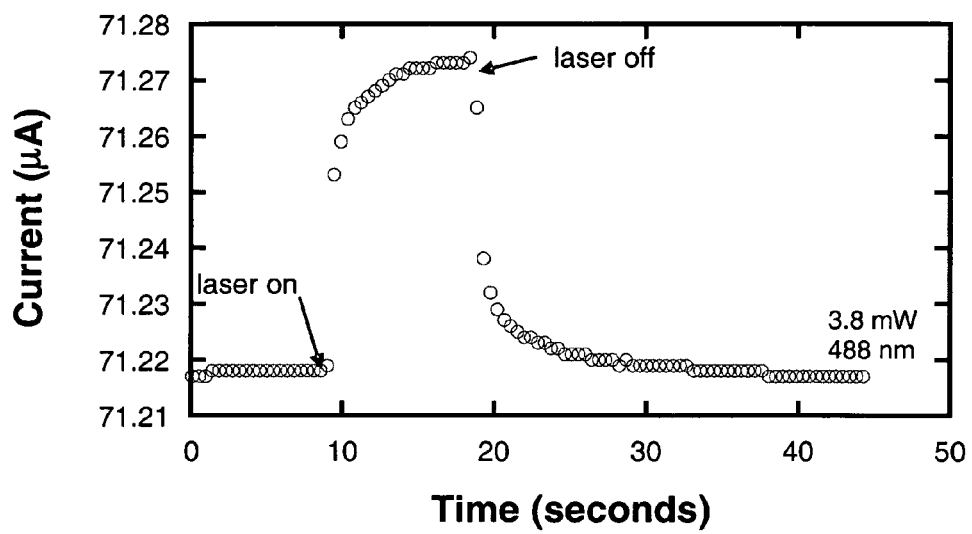
FIG. 15 provides two charts of data obtained from an optical detection application for a flexible electronic device in accordance with an exemplary embodiment of the present invention.
Figure 15:
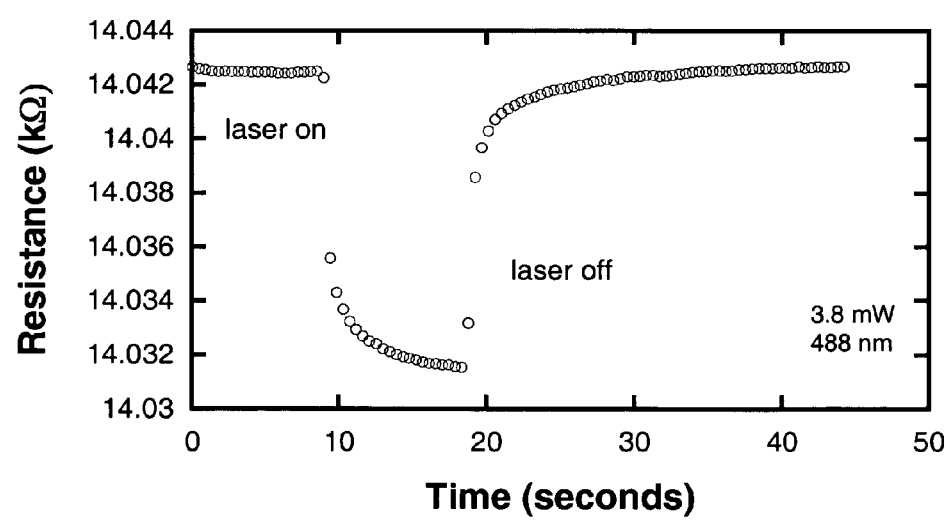

FIG. 15 provides two charts of data obtained from an optical detection application for a flexible electronic device in accordance with an exemplary embodiment of the present invention. The charts shown in FIG. 15 provides a both a current curve and a resistance curve for a flexible electronic device in accordance with the present invention when exposed to laser excitation. More specifically, the optical detection flexible electronic device used to generate the data for the chart of FIG. 15 was exposed to 488 nm argon laser excitation. The high sensitivity to laser light of the carbon nanotubes contained in the flexible electronic device in accordance with the present invention is illustrated in FIG. 10. When the flexible electronic device was exposed to 488 nm argon laser excitation, the current for the carbon nanotube circuits may be increased. As shown, when the laser was turned on, the current increased from approximately 71.21 μA to around 71.27 μA. Following Ohms law, the resistance of the flexible electronic device drops when the current increases. As shown in the resistance chart of FIG. 10, the resistance decreased when the laser was turned on from 14.042 kΩ to around 14.032 kΩ.

The embodiments described above with respect to systems and methods for nanomaterial transfer are also generally applicable to most nanomaterial structures. For example, nanowires may be synthesized on the template 350 in a manner similar to the carbon nanotubes and then pressed onto a substrate 360, where the substrate 360 is a flexible material such as a polymer. Applications of flexible electronic devices containing nanowires are almost as far reaching as applications involving carbon nanotubes, thus the methods and systems described herein for nanomaterial transfer may be as equally desired for nanowires applications.

While the invention has been disclosed in its preferred forms, it will be apparent to those skilled in the art that many modifications, additions, and deletions can be made therein without departing from the spirit and scope of the invention and its equivalents, as set forth in the following claims.

What is claimed is:

1. A method of nanomaterial transfer comprising the steps of:
    fabricating a template comprising a plurality of template mesas;
    synthesizing a plurality of nanomaterials having length on the plurality of template mesas;
    transferring the plurality of nanomaterials to a substrate by pressing the plurality of template mesas into the substrate, wherein the step of transferring the plurality of nanomaterials involves pressing the plurality of template mesas into the substrate such that no portion of the plurality of nanomaterials lies above a surface layer of the substrate; and
    removing the plurality of template mesas from the substrate, wherein the plurality of nanomaterials remain embedded within the substrate upon the removal of the plurality of template mesas.

2. The method of nanomaterial transfer of claim 1, wherein the substrate is a polymer material.

3. The method of nanomaterial transfer of claim 1, wherein the plurality of nanomaterials are synthesized in an arranged pattern.

4. The method of nanomaterial transfer of claim 1, further comprising the step of raising the temperature of the substrate to assist the transferring of the plurality of nanomaterials to the substrate.

5. The method of nanomaterial transfer of claim 1, further comprising the step of raising the temperature of the template and the substrate to assist the transferring of the plurality of nanomaterials to the substrate.

6. The method of nanomaterial transfer of claim 1, further comprising the step of heating the plurality of nanomaterials above the temperature of the substrate to transferring of the plurality of nanomaterials to the substrate.

7. The method of nanomaterial transfer of claim 1, wherein the plurality of nanomaterials is comprised of a plurality of carbon nanotubes.

8. The method of nanomaterial transfer of claim 1, wherein the plurality of nanomaterials is comprised of a plurality of nanowires.

9. The method of nanomaterial transfer of claim 1, wherein the substrate is a polymethal methacrylate material.

10. The method of nanomaterial transfer of claim 1, wherein no further steps are required after the transfer of the plurality of nanomaterials to arrange or prepare the nanomaterials.

11. The method of nanomaterial transfer of claim 6, wherein the step of heating the plurality of nanomaterials is carried out by exposing the plurality of nanomaterials to microwave energy.

12. The method of nanomaterial transfer of claim 11, wherein at least one end surface of a portion of the plurality of carbon nanotubes is exposed.

13. The method of nanomaterial transfer of claim 11, wherein the plurality of carbon nanotubes are randomly oriented after transfer to the substrate.

14. The method of nanomaterial transfer of claim 11, wherein the plurality of carbon nanotubes are oriented in a generally parallel manner after transfer to the substrate.

15. A method of providing a flexible electronic device comprising the steps of:
    providing a template with a plurality of template mesas;
    enabling the synthesis of a plurality of nanomaterials on the plurality of template mesas; and
    transferring the plurality of nanomaterials to a substrate by pressing the plurality of template mesas into a substrate, wherein the step of transferring the plurality of nanomaterials involves pressing the plurality of template mesas into the substrate such that no portion of the plurality of nanomaterials lies above a surface layer of the substrate; and
    removing the plurality of template mesas from the substrate, wherein the plurality of nanomaterials remain embedded within the substrate upon the removal of the plurality of template mesas.

16. The method of providing a flexible electronic device of claim 15, wherein the substrate is a polymer material.

17. The method of providing a flexible electronic device of claim 15, wherein the pressing of the template is done by hot embossing.

18. The method of providing a flexible electronic device of claim 15, wherein the substrate is a polymethal methacrylate material.

19. The method of providing a flexible electronic device of claim 15, wherein the template is comprised of a silicon base with a catalyst layer in predetermined areas, the catalyst layer defining the predetermined synthesis areas.

20. The method of providing a flexible electronic device of claim 15, wherein the plurality of nanomaterials is comprised of a plurality of carbon nanotubes.

21. The method of providing a flexible electronic device of claim 15, wherein the plurality of nanomaterials is comprised of a plurality of nanowires.

22. The method of providing a flexible electronic device of claim 15, further comprising the step of raising the temperature of the substrate to assist the transferring of the plurality of nanomaterials to the substrate.

23. The method of providing a flexible electronic device of claim 15, further comprising the step of raising the temperature of the template and the substrate to assist the transferring of the plurality of nanomaterials to the substrate.

24. The method of providing a flexible electronic device of claim 15, further comprising the step of raising the temperature of the plurality of nanomaterials above the temperature of the substrate to assist the transferring of the plurality of nanomaterials to the substrate.

25. The method of providing a flexible electronic device of claim 24, wherein the step of raising the temperature of the plurality of nanomaterials is carried out by exposing the plurality of nanomaterials to microwave energy.

* * * * *